(12) United States Patent
Ohta et al.

(10) Patent No.: US 7,910,440 B2
(45) Date of Patent: Mar. 22, 2011

(54) SEMICONDUCTOR DEVICE AND METHOD FOR MAKING THE SAME

(75) Inventors: Tsuyoshi Ohta, Yokohama (JP); Takahiro Kawano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 301 days.

(21) Appl. No.: 11/968,403

(22) Filed: Jan. 2, 2008

(65) Prior Publication Data

US 2008/0164517 A1 Jul. 10, 2008

(30) Foreign Application Priority Data

Jan. 9, 2007 (JP) .................................. 2007-001543

(51) Int. Cl.
*H01L 21/336* (2006.01)
(52) U.S. Cl. ......... 438/272; 257/E29.131; 257/E29.257; 257/330
(58) Field of Classification Search .................. 438/270, 438/272, 700, 702, 706; 257/E29.121, E29.131, 257/E29.257, E29.262, 330, 331, 332, 334
See application file for complete search history.

(56) References Cited

U.S. PATENT DOCUMENTS

| | | | |
|---|---|---|---|
| 6,621,107 B2 * | 9/2003 | Blanchard et al. | 257/155 |
| 6,750,511 B2 | 6/2004 | Kawano et al. | |
| 6,818,947 B2 * | 11/2004 | Grebs et al. | 257/330 |
| 6,919,249 B2 | 7/2005 | Kawano et al. | |
| 2004/0171271 A1 * | 9/2004 | Heo et al. | 438/700 |

FOREIGN PATENT DOCUMENTS

JP 2003-92405 3/2003

* cited by examiner

*Primary Examiner* — Matthew C Landau
*Assistant Examiner* — Jessica Hall
(74) *Attorney, Agent, or Firm* — Oblon, Spivak, McClelland, Maier & Neustadt, L.L.P.

(57) ABSTRACT

A semiconductor device includes: a first trench that is formed in a semiconductor substrate; a gate oxide film that is formed on a surface of the first trench; and a trench gate electrode that is formed so as to bury the first trench via the gate oxide film. The semiconductor device also includes: a second trench that is formed in the semiconductor substrate with a width wider than the width of the first trench; and a terminal-embedded insulation layer that is formed so as to bury the second trench. The semiconductor device further includes: a third trench that is formed in the semiconductor substrate with a width wider than the width of the second trench; and a trench contact electrode that is formed so as to bury the third trench.

7 Claims, 5 Drawing Sheets

SEMICONDUCTOR DEVICE AND METHOD FOR MAKING THE SAME

CROSS REFERENCE TO RELATED APPLICATIONS

This application is based on and claims the benefit of priority from prior Japanese Patent Application No. 2007-001543, filed on Jan. 9, 2007, the entire contents of which are incorporated herein by reference.

BACKGROUND OF THE INVENTION

1. Field of the Invention

The present invention relates to a semiconductor device and a method for making the same, and, in particular, to the field of a semiconductor device of a trench-gate type MOSFET and a method for making the same.

2. Description of the Related Art

MOS-type transistors, such as power MOSFETs (Field Effect Transistors) or IGBTs (Insulated Gate Bipolar Transistors), have been used as a semiconductor device for power control. In these semiconductor devices, it is required to have a reduced power loss and a lower capacitance characteristic in switching operation. A trench-gate structure is known to meet such needs, as disclosed in Japanese Patent Laid-Open No. 2003-92405.

When a semiconductor chip is actually made that includes a MOS-type transistor with such a trench-gate structure, a trench gate, a terminal-embedded insulation layer and a trench contact should be formed. In order to form these components, photolithography should be performed about 10 times, which results in increased cost due to the time consuming and expensive procedures.

SUMMARY OF THE INVENTION

A semiconductor device according to one aspect of the present invention comprises: a semiconductor substrate; a first trench formed in the semiconductor substrate; a gate oxide film formed on a surface of the first trench; a trench gate electrode formed so as to bury the first trench via the gate oxide film; a second trench formed in the semiconductor substrate with a width wider than the width of the first trench; a terminal-embedded insulation layer formed so as to bury the second trench; a third trench formed in the semiconductor substrate with a width wider than the width of the second trench; and a trench contact electrode formed so as to bury the third trench.

In addition, a method for making a semiconductor device according to another aspect of the present invention comprises: forming a narrower trench and a wider trench with different widths on the same surface of a semiconductor substrate; burying the inside of the narrower trench with film material through deposition of the film on a surface in the semiconductor substrate where the narrower trench and the wider trench are formed, whereas forming a film with a certain film thickness in the wider trench; and performing etching in the semiconductor substrate for leaving some portions of the film in the narrower trench and for removing film material in the wider trench.

In addition, a method for making a semiconductor device according to still another aspect of the present invention comprises: concurrently forming a first trench, a second trench wider than the first trench, and a third trench wider than the second trench on the same surface of a semiconductor layer; forming an oxide film on a surface of the semiconductor layer; filling up the first trench with conductive material without filling up the second trench and the third trench therewith, through deposition of the conductive material on the semiconductor layer where the oxide film is formed, the conductive material corresponding to a gate electrode; removing by etching the conductive material deposited in the second trench and the third trench with the conductive material being left in the first trench; filling up the second trench with insulating material without filling up the third trench therewith, through deposition of the insulating material on the semiconductor layer where the oxide film is formed, the insulating material corresponding to an embedded insulation layer; removing by etching the insulating material and the oxide film deposited in the third trench with the insulating material being left in the second trench; and covering at least an inner surface of the third trench with metallic material, through deposition of the metallic material on the semiconductor layer, the metallic material corresponding to an electrode film.

DETAILED DESCRIPTION OF THE EMBODIMENTS

One embodiment of the present invention will now be described below.

This embodiment corresponds to a trench-gate type MOSFET chip, which is made by forming three trenches, a trench gate, a terminal-embedded insulation film, and a trench contact with different widths, on a semiconductor substrate.

Now, a method for making the trench-gate type MOSFET chip will be described below.

Figure 1:
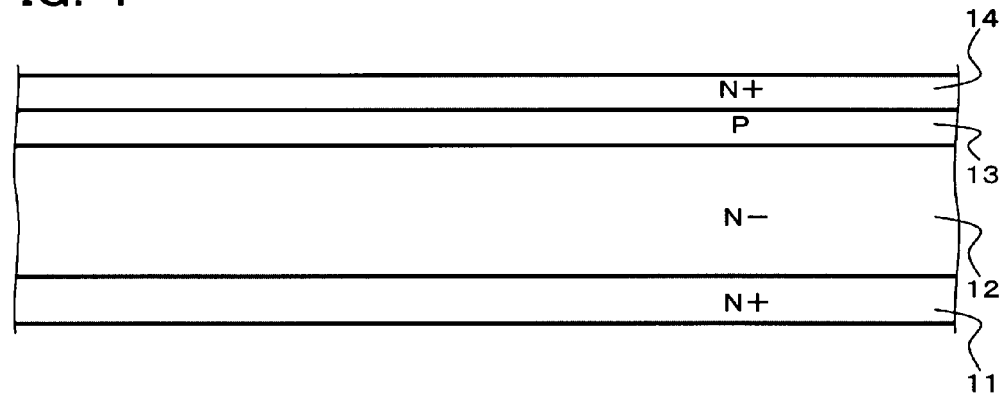
FIG. 1 is a process diagram (1) illustrating a method for making a semiconductor device according to one embodiment of the present invention.

As illustrated in FIG. 1, an N⁻ type drift layer 12 is formed on an N⁺ type semiconductor substrate 11. Additionally, a p-type base layer 13 is formed on the drift layer 12, in which about $3*10^{13}[/cm^2]$ of B (boron) is injected by ion implantation from a surface where the drift layer 12 is formed. Further, an N⁺ type source layer 14 is formed on the base layer 13, in which about $5*10^{15}[/cm^2]$ of As (arsenic) is injected by ion implantation.

Figure 2:
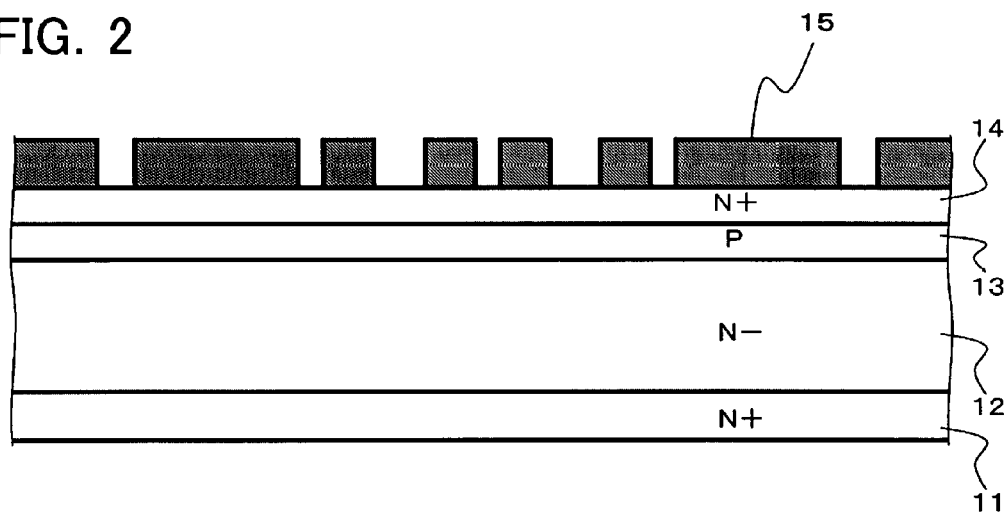
FIG. 2 is a process diagram (2) illustrating a method for making the semiconductor device according to the embodiment of the present invention.

Then, as shown in FIG. 2, a silicon oxide layer 15 is formed on the source layer 14 by thermal oxidation and CVD (Chemical Vapor Deposition), and then the first photolithography is performed to form a resist pattern. Specifically, after a photoresist is applied onto the silicon oxide layer 15, pre-baking, exposure and development are performed such that there would be formed. Thereby, a resist pattern is formed so that photoresist is removed only in regions where the trenches are to be formed.

Next, as illustrated in FIG. 2, the silicon oxide layer is etched by RIE (Reactive Ion Etching) in regions where the resist pattern is not formed. Then, after the silicon oxide layer 15 as a mask is formed, photoresist is removed by ashing or the like.

Figure 3:
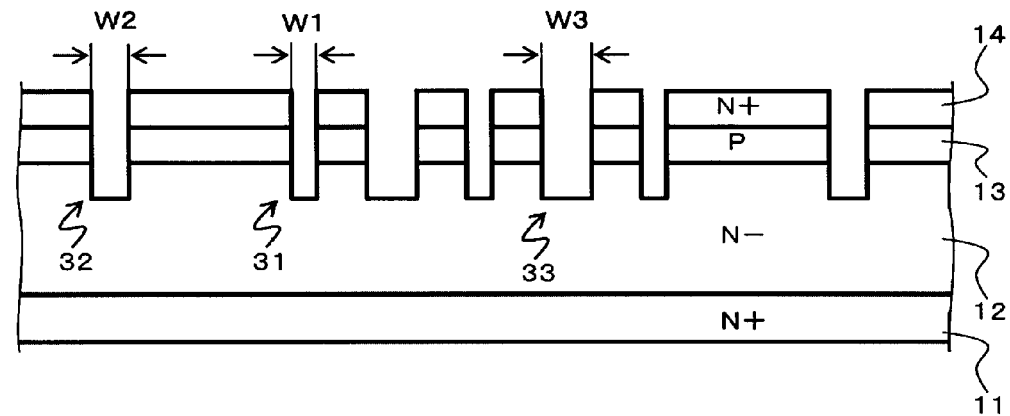
FIG. 3 is a process diagram (3) illustrating a method for making the semiconductor device according to the embodiment of the present invention.

Next, as illustrated in FIG. 3, a part of the source layer 14, the base layer 13 and the drift layer 12 is etched by RIE. The parts etched by RIE reside in regions where a silicon oxide layer 15 corresponding to a mask is not formed. Subsequently, the silicon oxide layer 15 as a mask is removed by wet etching employing fluorinated acid or the like. As a result, three types of trenches are formed; a first trench 31 with width W1 that corresponds to a trench gate, a second trench 32 with width W2 to form a terminal-embedded insulation layer, and a third trench 33 with width W3 to form a trench contact.

As for the width of each trench, the width W2 is larger than the width W1 and the width W3 larger than the width W2. For example, the width W1 is 0.4 [μm], the width W2 is 0.5 [μm], and the width W3 is 0.7 [μm].

Figure 4:
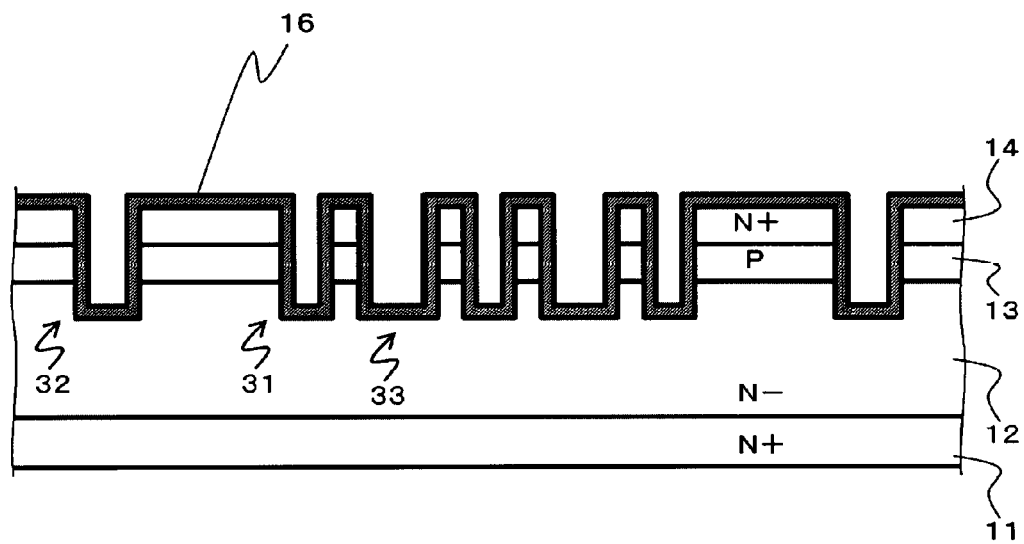
FIG. 4 is a process diagram (4) illustrating a method for making the semiconductor device according to the embodiment of the present invention.

Next, as illustrated in FIG. 4, a gate insulation layer 16 is formed by thermal oxidation. As a result, the gate insulation layer 16 of silicon oxide is formed over the entire surface including the inside of each trench.

Figure 5:
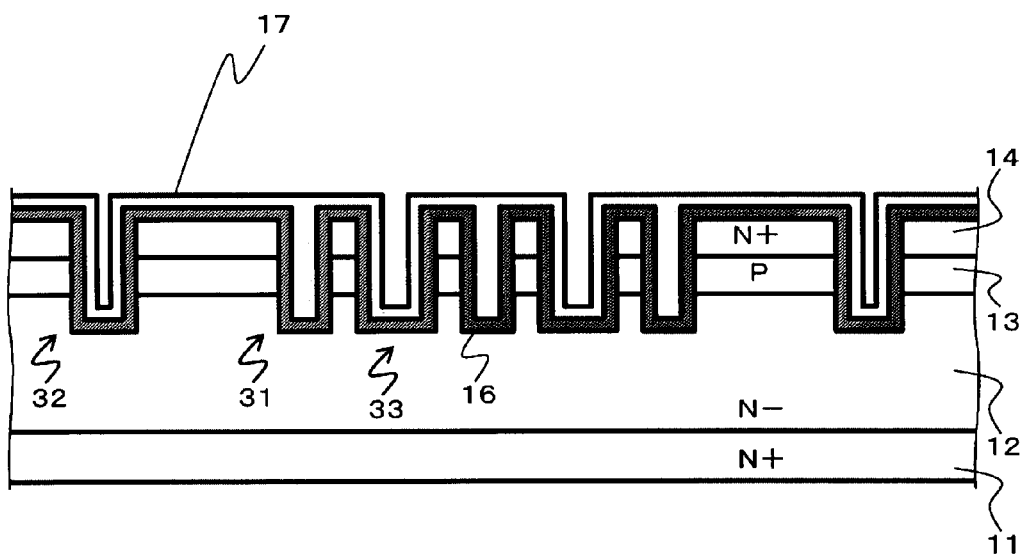
FIG. 5 is a process diagram (5) illustrating a method for making the semiconductor device according to the embodiment of the present invention.

Next, as illustrated in FIG. 5, a polysilicon layer 17 is formed by CVD. In this deposition of the polysilicon layer 17 employing CVD, the whole region inside each narrower first trench 31 with the width W1 is filled up with the polysilicon layer 17. On the contrary, regarding each wider second trench 32 with the width W2 and each third trench 33 with the width W3, the polysilicon layer 17 is just formed on the inner surface of these trenches 32 and 33, and they would retain their trench structures accordingly.

Figure 6:
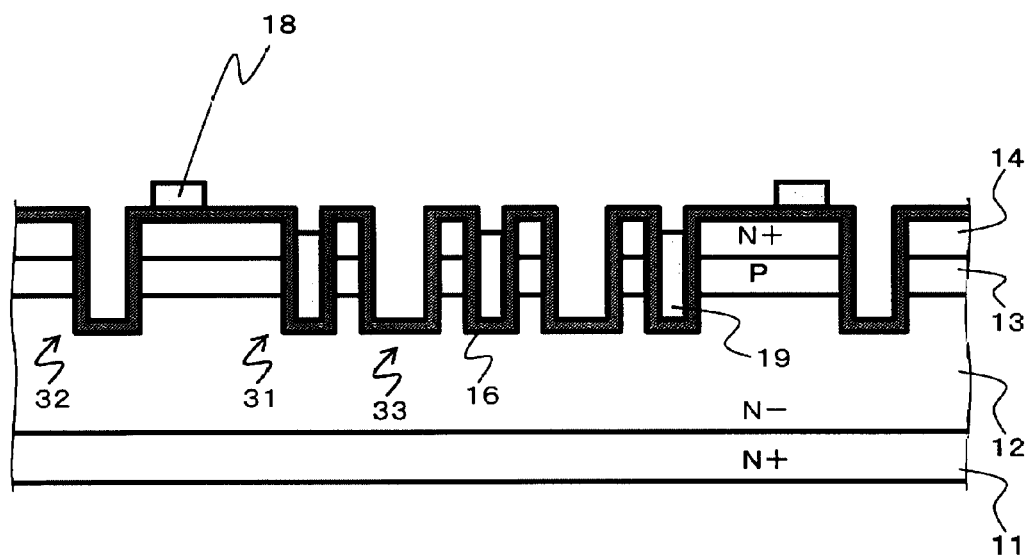
FIG. 6 is a process diagram (6) illustrating a method for making the semiconductor device according to the embodiment of the present invention.

Next, as illustrated in FIG. 6, gate wires 18 and trench gate electrodes 19 are formed. Specifically, the second photolithography is performed in a similar manner to the above. There would be formed a resist pattern so that a resist is formed only in the region where the gate wires 18 of polysilicon or the like are formed. Then, etching is performed by CDE (Chemical Dry Etching) as to the polysilicon layer 17 that resides in regions where a resist is not formed. This etching employing CDE is isotropic etching. Specifically, the polysilicon layer 17 formed on the surface of the source layer 14 via the gate insulation layer 16 is completely removed, whereas a part of the polysilicon layer 17 formed in the first trenches 31 is left. As a result, the trench gate electrode 19 is formed. In this respect, by this etching employing CDE, the polysilicon layer 17 formed in the second and third trenches 32 and 33 are all removed.

Figure 7:
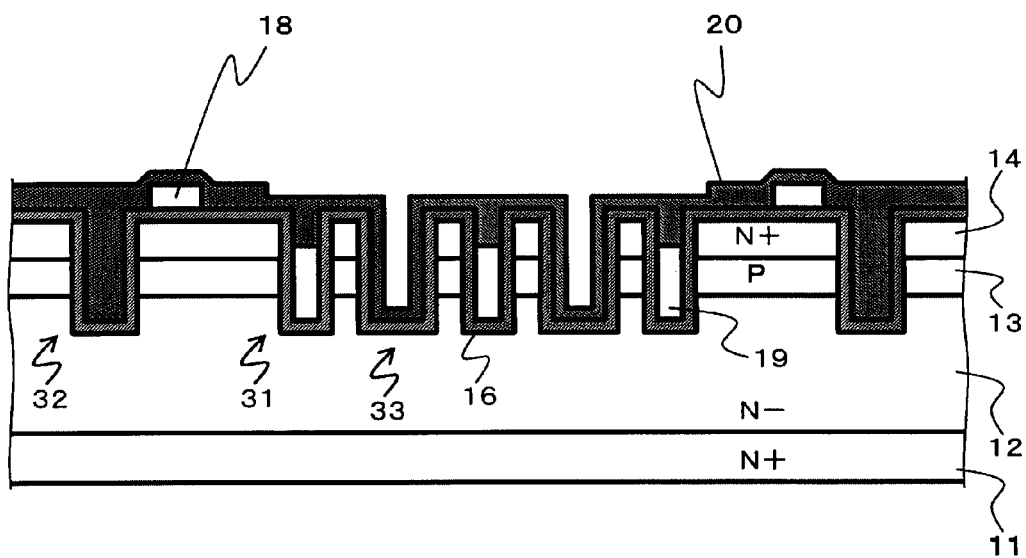
FIG. 7 is a process diagram (7) illustrating a method for making the semiconductor device according to the embodiment of the present invention.

Next, as illustrated in FIG. 7, an interlayer insulating film 20 as silicon oxide is formed by CVD on the surface of the semiconductor substrate 11 in which the gate insulation layer 16 and the gate wires 18 are formed. In this deposition of the interlayer insulating film 20 employing CVD, the narrower second trench 32 with the width W2 is filled up with the interlayer insulating film 20. On the contrary, regarding the wider third trench 33 with the width W3, the interlayer insulating film 20 is just formed on the inner surface of the trench 33, and the trench 33 would retain its trench structure accordingly. The interlayer insulating film 20 is deposited by CVD where films are isotropically grown.

However, the interlayer insulating film 20 is actually formed to be comparatively thinner in regions where the first trenches 31 and the third trenches 33 are formed. This is because the trenches 31 and 33 are formed to have a high density and a high concavity and convexity. On the other hand, the interlayer insulating film 20 is actually formed to be comparatively thicker in regions where the second trenches 32 are formed. This is because the trenches 32 are formed to have a low density and a low concavity and convexity.

Figure 8:
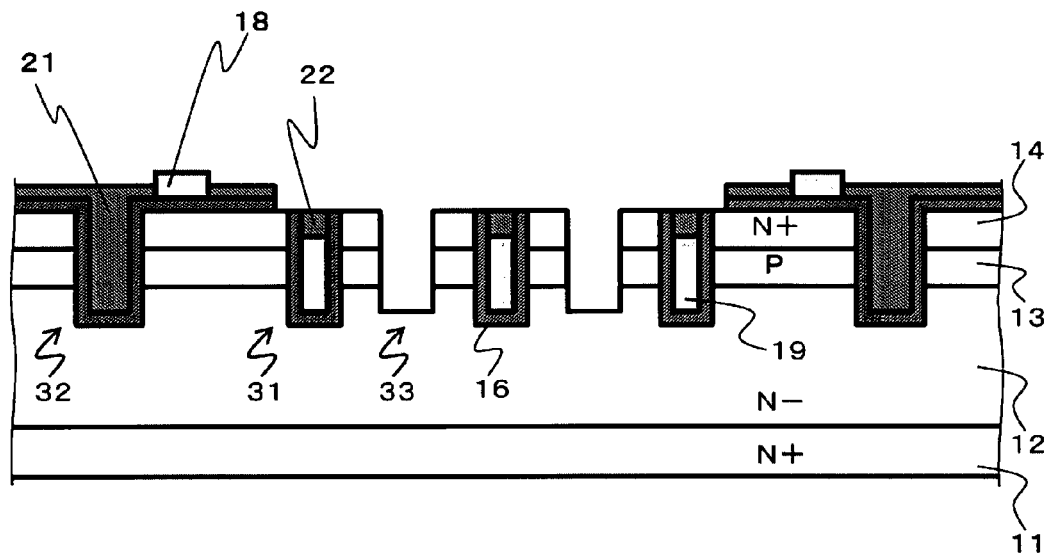
FIG. 8 is a process diagram (8) illustrating a method for making the semiconductor device according to the embodiment of the present invention.

Next, as illustrated in FIG. 8, etching is performed on the interlayer insulating film 20. Specifically, wet etching (isotropic etching) employing fluorinated acid or the like is performed on the interlayer insulating film 20. The interlayer insulating film 20 with a comparatively thinner film thickness has been formed in the regions where the first trenches 31 and the third trenches 33 are formed. In this wet etching, the interlayer insulating film 20 and the gate insulation layer 16 on the source layer 14 that reside in the above-mentioned regions are completely removed. Similarly, the interlayer insulating film 20 and the gate insulation layer 16 in the third trenches 33 is also removed since they are formed with a substantially same film thickness as the former mentioned portions.

On the other hand, the interlayer insulating film 20 with a comparatively thicker film thickness is formed in the regions where the second trenches 32 are formed. Accordingly, the interlayer insulating film 20 as well as the gate insulation layer 16 on the source layer 14 in the above-mentioned regions are left without being completely removed.

In addition, since the interlayer insulating film 20 in the second trench 32 is embedded inside the second trench 32, the interlayer insulating film 20 is not removed by the above-mentioned etching but left therein. This interlayer insulating film left therein forms the interlayer-insulating layer 21. The interlayer-insulating layer 21 and the gate insulation layer 16 form the terminal-embedded insulation layer. In this respect, in each first trench 31, since the interlayer insulating film 20 formed on the surface of the trench gate electrode 19 is formed in a filled-up state, the interlayer insulating film 20 is left without being completely removed, which forms an insulation layer 22.

Figure 9:
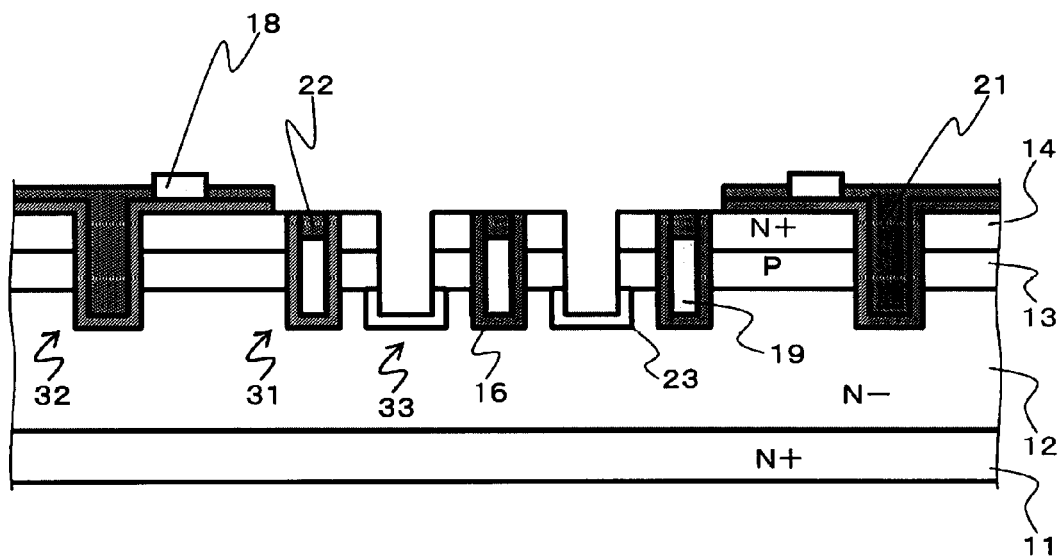
FIG. 9 is a process diagram (9) illustrating a method for making the semiconductor device according to the embodiment of the present invention.

Next, as illustrated in FIG. 9, a p⁺ type contact layer 23 is formed in those regions by implanting ion, such as boron (B), where the drift layer 12 of the third trench 33 is exposed. Specifically, the concentration of boron (B) for ion implantation in this step is about $1*10^{15}[/cm^2]$. In this respect, although ion (B) is also injected into the source layer 14 with an exposed surface in this step, such ion implantation employing B would not affect the source layer 14, since the source layer 14 is a highly-concentrated N⁺ type semiconductor region as described above.

Figure 10:
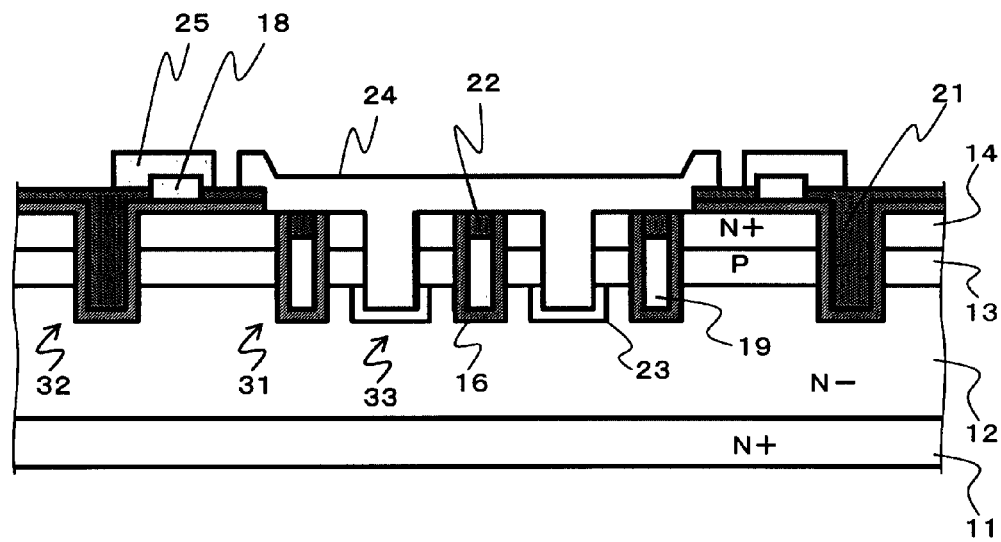
FIG. 10 is a process diagram (10) illustrating a method for making the semiconductor device according to the embodiment of the present invention.

Next, as illustrated in FIG. 10, a metal source electrode 24 and a metal gate electrode 25 are formed. Specifically, in the semiconductor substrate 11, an Al (aluminum) film is formed on the surface by spattering where the third trench 33 is formed. After that, the third photolithography is performed in a similar manner to the above and there would be formed a resist pattern so that a resist is formed only in the region where an electrode is formed. Then, etching is performed by RIE on Al films that reside in regions where a resist is not formed, after which the resists are removed. As a result, the metal source electrode 24 and the metal gate electrode 25 are formed accordingly.

Figure 11:
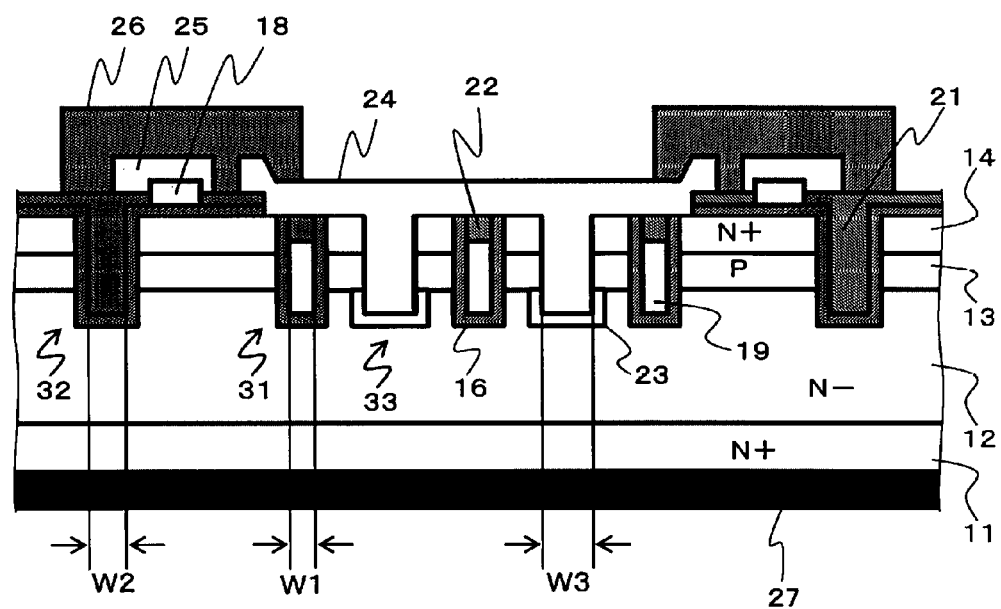
FIG. 11 is a sectional view of the semiconductor device according to the embodiment of the present invention.

Next, as illustrated in FIG. 11, a polyimide layer 26 is formed. Specifically, after polyimide is applied onto the surface where the metal source electrode 24 and the metal gate electrode 25 are formed, the fourth photolithography is performed in a similar manner to the above, thereby forming a resist pattern such that the polyimide could be left in the region where the metal gate electrode 25 is formed. Then, wet etching employing solvent or the like is performed on the polyimide formed in a region where a resist is not formed, after which the resists are removed. As a result, the polyimide layer 26 is formed. Then, a drain electrode 27 is formed by, e.g., spattering metallic material on a surface opposite to the surface where the polyimide layer 26 is formed in the semiconductor substrate 11.

The trench-gate type MOSFET chip according to the embodiment of the present invention is made through the above-mentioned steps. In this method according to the embodiment of the present invention, the number of times photolithography is performed is four (4 times). This enables a trench-gate type MOSFET chip to be made in one-half times or less in comparison to the conventional method, thereby reducing production costs.

As described above, three types of trenches are formed in the trench-gate type MOSFET chip; the first trench 31 with width the W1 that is formed in the semiconductor substrate 11 to form a trench gate, the second trench 32 with the width W2 to form a terminal-embedded insulation layer, and the third trench 33 with the width W3 to form a trench contact. The gate insulation layer 16 is formed on the inner surface of the first trench 31, and the trench gate electrode 19 is formed by embedding polysilicon therein. In addition, a terminal-embedded insulation layer, which includes the gate insulation layer 16 and a filled-up interlayer-insulating layer 21, is formed in the second trench 32. In addition, a metal source electrode 24 as a trench contact is formed in the third trench 33. As such, the trench-gate type MOSFET chip according to the embodiment of the present invention is formed with a different material embedded in each trench.

In embedding process for forming a layer according to the embodiment of the present invention a film is just formed on the inner surface of the wider trench so that the wider trench could not completely be filled up therewith and retains its trench structure. On the other hand, a film is deposited until the narrower trench is completely filled up therewith. To obtain the above, an important factor is the relationship between the trench width of the narrower trench and that of the wider trench. Based on the inventor's experience, provided that the width of the narrower trench is "1" and if the width of the wider trench is not less than "1.2", the narrower trench may be completely filled up with film material, while the wider trench may not be completely filled up with film material and retain its trench structure, although a film could be formed in that wider trench. In this respect, in order to prevent increase in size of the semiconductor device to be made, the width of the wider trench is preferably not more than "2.0" when the width of the narrower trench is "1".

Then, etching is performed such that one film formed in the wider trench could be removed and the other film formed in the narrower trench could be left. Iteration of these steps may reduce the number of steps for a resist pattern formation by photolithography as well as the cost for making semiconductor devices.

In this respect, although it is preferable to employ CVD or the like for trench deposition, by which a film is isotropically grown and a trench could be filled up in a short time period, other methods for depositing films may be used. In addition, although it is preferable to employ an isotropic etching method such as CDE or wet etching for etching the deposited films in order to remove film material formed in the wider trench without removing any film material filled up in the narrower trench, other etching methods may be used.

Although the semiconductor device and the method for making the same according to the present invention have been described with reference to one embodiment thereof, the present invention is not limited to the above-mentioned embodiment and may take any other forms than those specifically described herein.

What is claimed is:

1. A method for making the semiconductor device comprising:
    concurrently forming a first trench, a second trench wider than the first trench, and a third trench wider than the second trench on the same surface of a semiconductor layer;
    forming an oxide film on a surface of the semiconductor layer;
    filling up the first trench with conductive material without filling up the second trench and the third trench therewith, through deposition of the conductive material on the semiconductor layer where the oxide film is formed, the conductive material corresponding to a gate electrode;
    removing by etching all of the conductive material deposited in the second trench and the third trench with the conductive material being left in the first trench;
    filling up the second trench with insulating material without filling up the third trench therewith, through deposition of the insulating material on the semiconductor layer where the oxide film is formed, the insulating material corresponding to an embedded insulation layer;
    removing by etching all of the insulating material and all of the oxide film deposited in the third trench with the insulating material being left in the second trench; and
    covering at least an inner surface of the third trench with metallic material, through deposition of the metallic material on the semiconductor layer, the metallic material corresponding to an electrode film.

2. The method for making the semiconductor device according to claim 1, wherein
    the trench-formed density in a region where the second trench is formed is lower than the trench-formed density in each region where the first trench and the third trench are formed respectively, and the second trench is filled up with the insulating material through deposition of the insulating material with CVD.

3. The method for making the semiconductor device according to claim 1, wherein
    the second trench is formed in such a way that the width of the second trench is at least 1.2 times larger than the width of the first trench, and the third trench is formed in such a way that the width of the third trench is at least 1.2 times larger than the width of the second trench.

4. The method for making the semiconductor device according to claim 1, wherein the second trench is formed in such a way that the width of the second trench is twice or less as large as the width of the first trench, and the third trench is formed in such a way that the width of the third trench is twice or less as large as the width of the second trench.

5. The method for making the semiconductor device according to claim 1, wherein the etching is isotropic etching.

6. The method for making the semiconductor device according to claim 1, wherein the etching is wet etching or chemical dry etching.

7. The method for making the semiconductor device according to claim 1, wherein the width of the first trench is 0.4 µm, the width of the second trench is 0.5 µm, and the width of the third trench is 0.7 µm.

* * * * *